(12) United States Patent
Mohamadi

(10) Patent No.: US 7,126,541 B2
(45) Date of Patent: Oct. 24, 2006

(54) BEAM FORMING PHASED ARRAY SYSTEM IN A TRANSPARENT SUBSTRATE

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 0 days.

(21) Appl. No.: 11/049,098

(22) Filed: Feb. 2, 2005

(65) Prior Publication Data

US 2005/0151698 A1     Jul. 14, 2005

Related U.S. Application Data

(60) Continuation-in-part of application No. 11/004,402, filed on Dec. 3, 2004, which is a division of application No. 10/423,160, filed on Apr. 25, 2003, now Pat. No. 6,870,503.

(60) Provisional application No. 60/436,749, filed on Dec. 27, 2002, provisional application No. 60/431,587, filed on Dec. 5, 2002, provisional application No. 60/428,409, filed on Nov. 22, 2002, provisional application No. 60/427,665, filed on Nov. 19, 2002.

(51) Int. Cl.
*H01Q 1/38* (2006.01)

(52) U.S. Cl. .............................. 343/700 MS
(58) Field of Classification Search .......... 343/795, 343/700 MS, 702, 777, 778, 826, 893; 342/372, 342/368
See application file for complete search history.

(56) References Cited

U.S. PATENT DOCUMENTS 4,876,548 A * 10/1989 Lopez ........................ 342/368
4,881,050 A * 11/1989 Swanson, Jr. ............... 333/185
6,087,989 A *  7/2000 Song et al. .......... 343/700 MS
6,496,143 B1* 12/2002 Vail et al. ................... 342/372
6,703,976 B1*  3/2004 Jacomb-Hood et al. ..... 342/373

FOREIGN PATENT DOCUMENTS

| JP | 10-173425 | 6/1998 |
|----|-----------|--------|
| JP | 11-312919 | 11/1999 |
| JP | 2002-076750 | 3/2002 |
| JP | 2002-158529 | 5/2002 |

* cited by examiner

*Primary Examiner*—Shih-Chao Chen
*Assistant Examiner*—Minh Dieua
(74) *Attorney, Agent, or Firm*—Jonathan W. Hallman; MacPherson Kwok Chen & Heid LLP

(57) ABSTRACT

In one embodiment, an antenna array is provided that includes a transparent substrate, a plurality of antennas formed on a surface of the transparent substrate, and an integrated circuit, the integrated circuit including an RF beam forming interface circuit adapted to perform at least one of phase-shifting and attenuating an RF signal according to a transmit beam forming command to form an RF driving signal for driving the plurality of antennas, the RF beam forming interface circuit also adapted to perform at least one of phase-shifting and attenuating a received RF signal from the plurality of antennas according to a receive beam forming command.

20 Claims, 18 Drawing Sheets

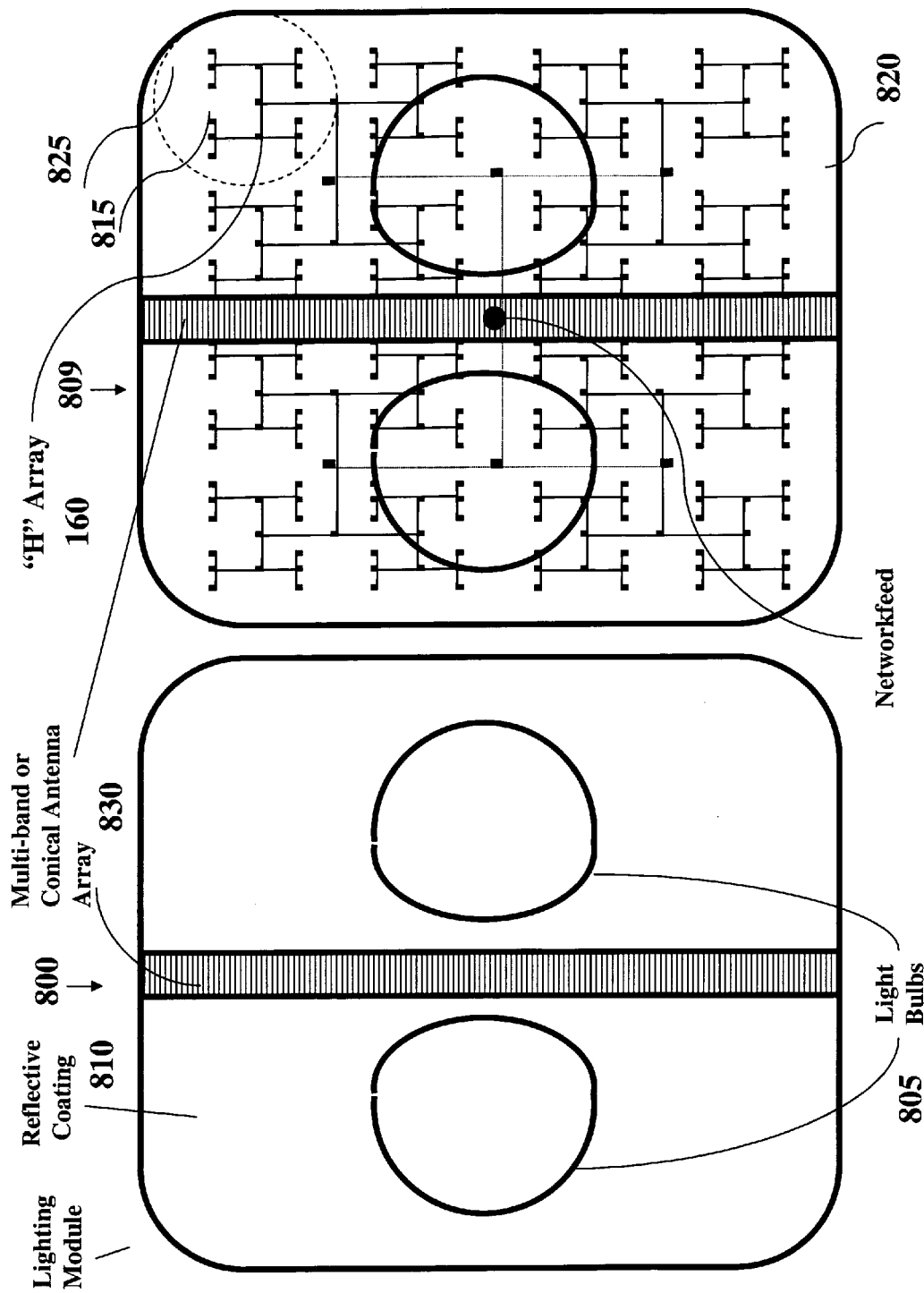

BEAM FORMING PHASED ARRAY SYSTEM IN A TRANSPARENT SUBSTRATE

RELATED APPLICATION

This application is a continuation-in-part of U.S. Ser. No. 11/004,402, filed Dec. 3, 2004, which in turn is a divisional application of U.S. Ser. No. 10/423,160, filed Apr. 25, 2003 now U.S. Pat. No. 6,870,503 which claims the benefit of U.S. Provisional Application No. 60/427,665, filed Nov. 19, 2002, U.S Provisional Application No. 60/428,409, filed Nov. 22, 2002, U.S. Provisional Application No. 60/431,587, filed Dec. 5, 2002, and U.S. Provisional Application No. 60/436,749, filed Dec. 27, 2002. The contents of all six of these applications are hereby incorporated by reference in their entirety.

TECHNICAL FIELD

The present invention relates generally to antennas, and more particularly to an antenna adapted for mounting on a transparent substrate.

BACKGROUND

Conventional high-frequency antennas are often cumbersome to manufacture. For example, antennas designed for 100 GHz bandwidths typically use machined waveguides as feed structures, requiring expensive micro-machining and hand-tuning. Not only are these structures difficult and expensive to manufacture, they are also incompatible with integration to standard semiconductor processes.

As is the case with individual conventional high-frequency antennas, beam forming arrays of such antennas are also generally difficult and expensive to manufacture. Conventional beam forming arrays require complicated feed structures and phase-shifters that are impractical to be implemented in a semiconductor-based design due to its cost, power consumption and deficiency in electrical characteristics such as insertion loss and quantization noise levels. In addition, conventional beam forming arrays become incompatible with digital signal processing techniques as the operating frequency is increased. For example, at the higher data rates enabled by high frequency operation, multipath fading and cross-interference becomes a serious issue. Adaptive beam forming techniques are known to combat these problems. But adaptive beam forming for transmission at 10 GHz or higher frequencies requires massively parallel utilization of A/D and D/A converters.

Beam forming techniques are useful in applications such as automotive collision avoidance. The beam from such a system should project forward from the vehicle to detect oncoming hazards. However, esthetic and aerodynamic concerns limit the opportunity to mount an antenna array on the vehicles. A convenient location would be either in the headlights or the windshield. However, such a mounting must not interfere with the vision of the driver or the headlight intensity. Accordingly, there is a need in the art for a semiconductor-based antenna array compatible with transparent substrates.

SUMMARY

In accordance with one aspect of the invention, an antenna array is provided that includes a transparent substrate, a plurality of antennas formed on a surface of the transparent substrate, and an integrated circuit, the integrated circuit including an RF beam forming interface circuit adapted to perform at least one of phase-shifting and attenuating an RF signal according to a transmit beam forming command to form an RF driving signal for driving the plurality of antennas, the RF beam forming interface circuit also adapted to perform at least one of phase-shifting and attenuating a received RF signal from the plurality of antennas according to a receive beam forming command.

In accordance with another aspect of the invention, a method of manufacturing an antenna array is provided that includes the acts of: providing an integrated circuit including a RF beam forming interface circuit adapted to perform at least one of phase-shifting and attenuating an RF signal according to a transmit beam forming command to form an RF driving signal, the RF beam forming interface circuit also adapted to perform at least one of phase-shifting and attenuating a received RF signal according to a receive beam forming command; etching a cavity in a transparent substrate; securing the integrated circuit in the cavity; forming conductor-filled vias from the cavity to a surface of the transparent substrate; and forming a plurality of antennas on the surface of the transparent, each antenna being coupled to corresponding ones of the conductor-filled vias, wherein the integrated circuit is secured in the cavity such that the RF driving signals drives the plurality of antennas and the received RF signal couples from the plurality of antennas to the RF beam forming circuit In accordance with another aspect of the invention, an antenna circuit is provided comprising: a substrate, a first longitudinal conducting plate formed on the substrate; a first dielectric layer formed on the first longitudinal conducting plate; a second longitudinal conducting plate formed on the first dielectric layer; a first plurality of conducting vias extending from a first side of the first longitudinal conducting plate to a first side of the second longitudinal conducting plate; a second plurality of conducting vias extending from a second side of the first longitudinal conducting plate to a second side of the second longitudinal conducting plate, wherein the combination of the first and second longitudinal conducting plates and the first and second conducting vias forms a rectangular waveguide encompassing a portion of the first dielectric layer; at least one antenna formed on the substrate; a circuit integrated wit the substrate and adapted to receive an RF signal from the waveguide, the integrated circuit including an RF beam forming interface circuit adapted to perform at least one of phase-shifting and attenuating the RF signal according to a transmit beam forming command to form an RF driving signal for driving the at least one antenna, the RF beam forming interface circuit also adapted to perform at least one of phase-shifting and attenuating a received RF signal from the first plurality of antennas according to a receive beam forming command to form an adjusted received RF signal, the RF beam forming interface circuit being adapted to transmit the adjusted received RF signal into the waveguide.

The invention will be more fully understood upon consideration of the following detailed description, taken together with the accompanying drawings.

BRIEF DESCRIPTION OF THE DRAWINGS

FIG. 8a is a front view of a conventional automotive headlight.

FIG. 8b is a front view of an automotive headlight including an antenna array according to an embodiment of the invention.

FIG. 9 is a close-up view of a portion of the antenna array of FIG. 8a.

DETAILED DESCRIPTION

The present invention provides a beam forming antenna array that is compatible for use with a transparent substrate. This antenna array utilizes and expands upon the beam forming capabilities described in copending U.S. Ser. No. 10/423,303, filed Apr. 25, 2003, Ser. No. 10/423,106, filed Apr. 25, 2003, Ser. No. 10/422,907, filed Apr. 25, 2003, Ser. No. 10/423,129, filed Apr. 25, 2003, Ser. No. 10/860,526, filed Jun. 3, 2004, and Ser. No. 10/942,383, filed Sep. 16, 2004, the contents of all of which are hereby incorporated by reference in their entirety.

Figure 1:
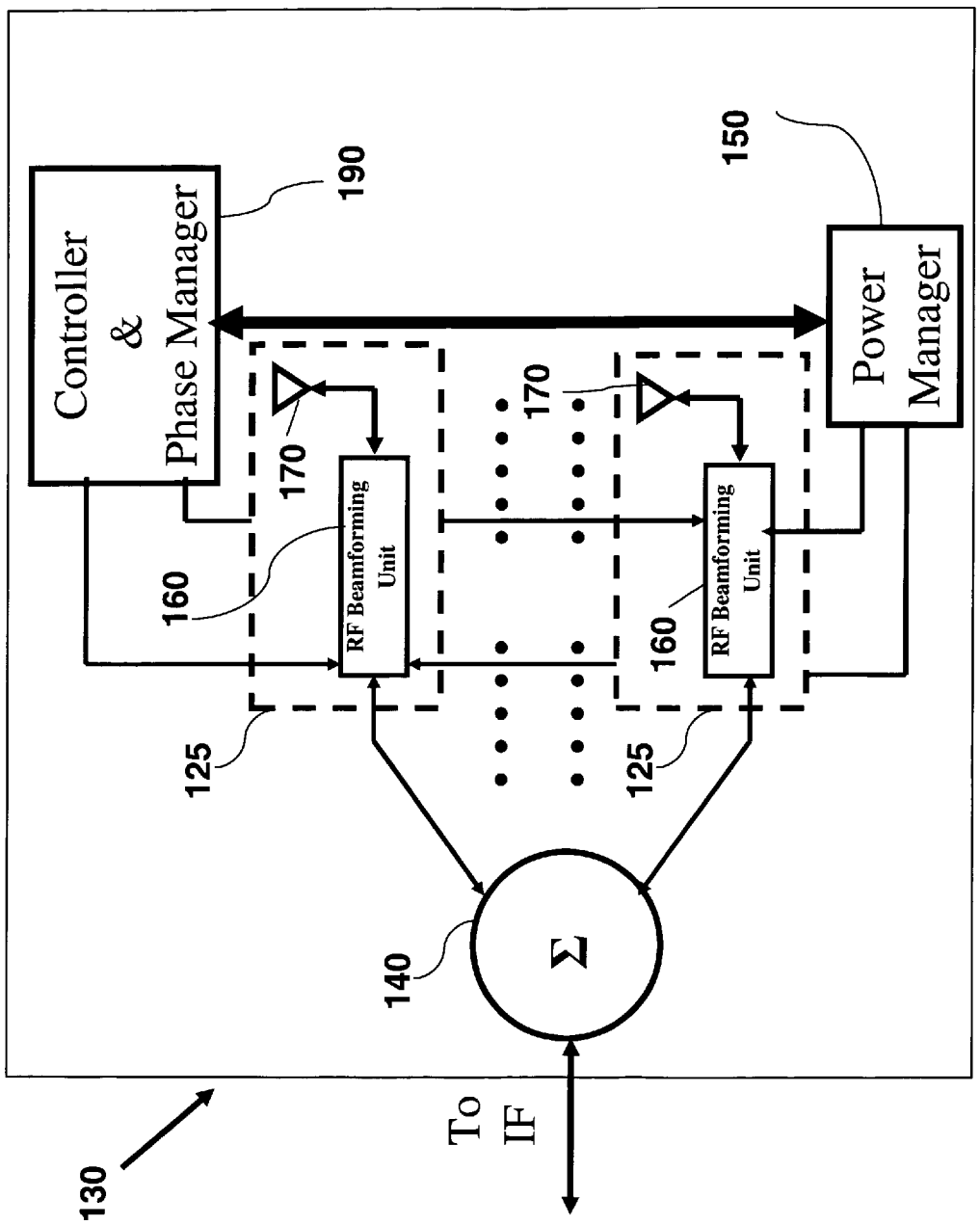
FIG. 1 is a block diagram of a beam forming antenna array.
Figure 2:
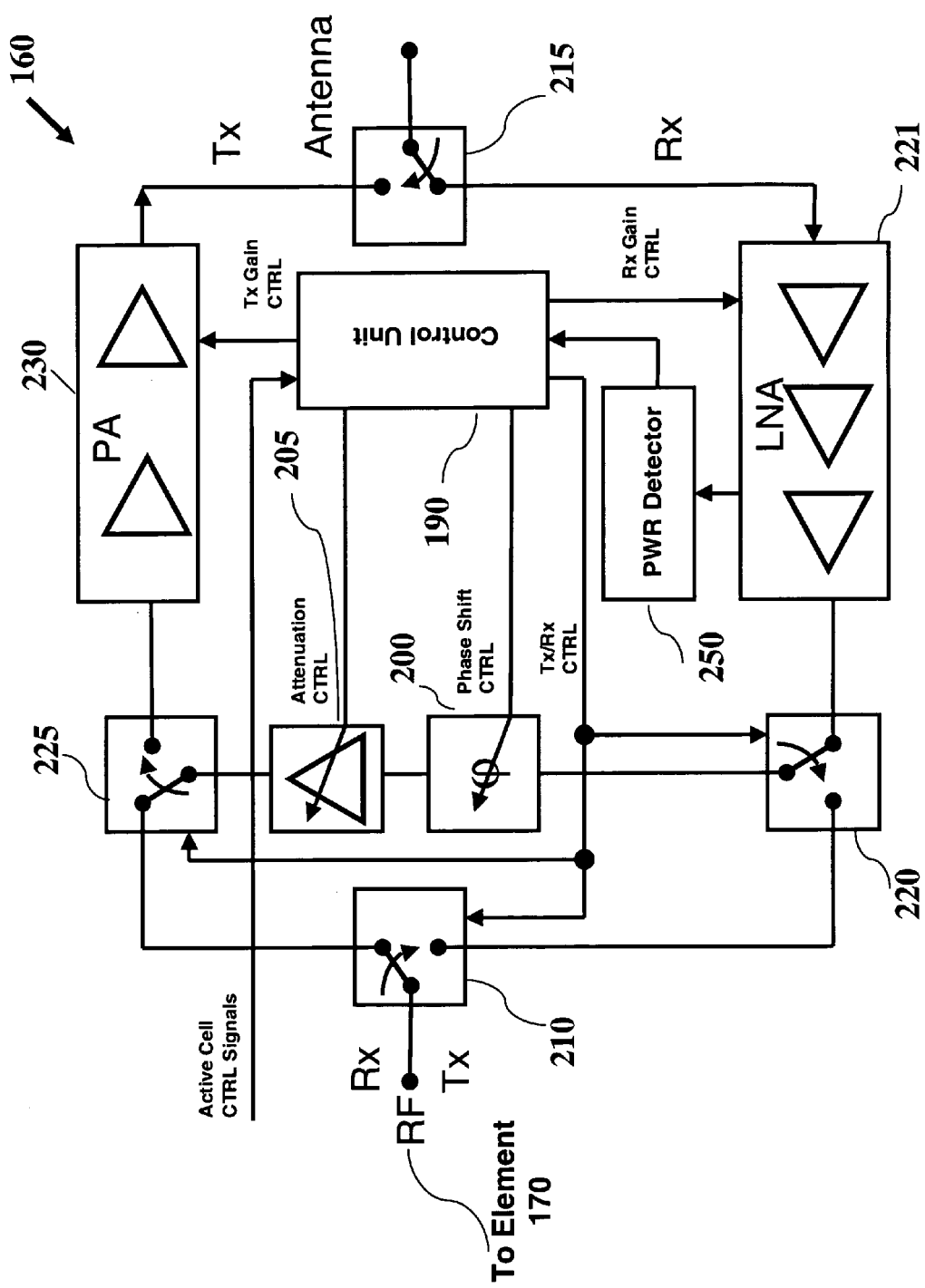
FIG. 2 is a schematic illustration of an RF beam forming interface circuit for the array of FIG. 1.

One embodiment of a beam forming antenna system described in the above-described applications is shown in FIG. 1, which illustrates an RF beam forming and controller unit 130. In this embodiment, the receive and transmit antenna arrays are the same such that each antenna 170 functions to both transmit and receive. A plurality of integrated antenna circuits 125 each includes an RF beam forming interface circuit 160 and receive/transmit antenna 170. RF beam forming interface circuit 160 adjusts the phase and/or the amplitude of the received and transmitted RF signal responsive to control from a controller/phase manager circuit 190. A circuit diagram for an exemplary embodiment of RF beam forming interface circuit 160 is shown in FIG. 2. Note that the beam forming performed by beam forming circuits 160 may be performed using either phase shifting, amplitude shifting, or a combination of both phase shifting and amplitude shifting. Accordingly, RF beam forming interface circuit 160 is shown including both a variable phase shifter 200 and a variable attenuator 205. It will be appreciated, however, that the inclusion of either phase shifter 200 or attenuator 205 will depend upon the type of beam forming being performed. To provide a compact design, RF beam forming circuit may include RF switches/multiplexers 210, 215, 220, and 225 so that phase shifter 200 and attenuator 205 may be used in either a receive or transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The resulting shifted signal routes through RF switch 225 to RF switch 210. RF switch 210 then routes the signal to IF processing circuitry (not illustrated).

In a transmit configuration, the RF signal received from the IF processing circuitry routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beam forming interface circuit 160 may be constructed not including switches 210, 220, and 225 such that the receive and transmit paths do not share phase shifter 200 and/or attenuator 205. In such embodiments, RF beam forming interface circuit 160 would include separate phase-shifters and/or attenuators for the receive and transmit paths.

To provide the beam forming capability, a power detector 250 functions as a received signal strength indicator to measure the power in the received RF signal. For example, power detector 250 may comprise a calibrated envelope detector. Power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beam forming direction may simply be commanded by controller/phase manager 190 rather than derived from a received signal. In such embodiment, power managers 150 and 250 need not be included since phasing information will not be derived from a received RF signal.

Regardless of whether integrated antenna circuits 125 perform their beam forming using phase shifting and/or amplitude shifting, the shifting is performed on the RF signal received either from the IF stage (in a transmit mode) or from its antenna 170 (in a receive mode). By performing the beam forming directly in the RF domain as discussed with respect to FIGS. 1 and 2, substantial savings are introduced over a system that performs its beam forming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beam forming is performed in the RF domain. The injection of phase and/or attenuation control signals by controller/phase manager circuit 190 into each integrated antenna circuit 125 may be performed inductively as discussed in U.S. Ser. No. 10/423,129.

Figure 3:
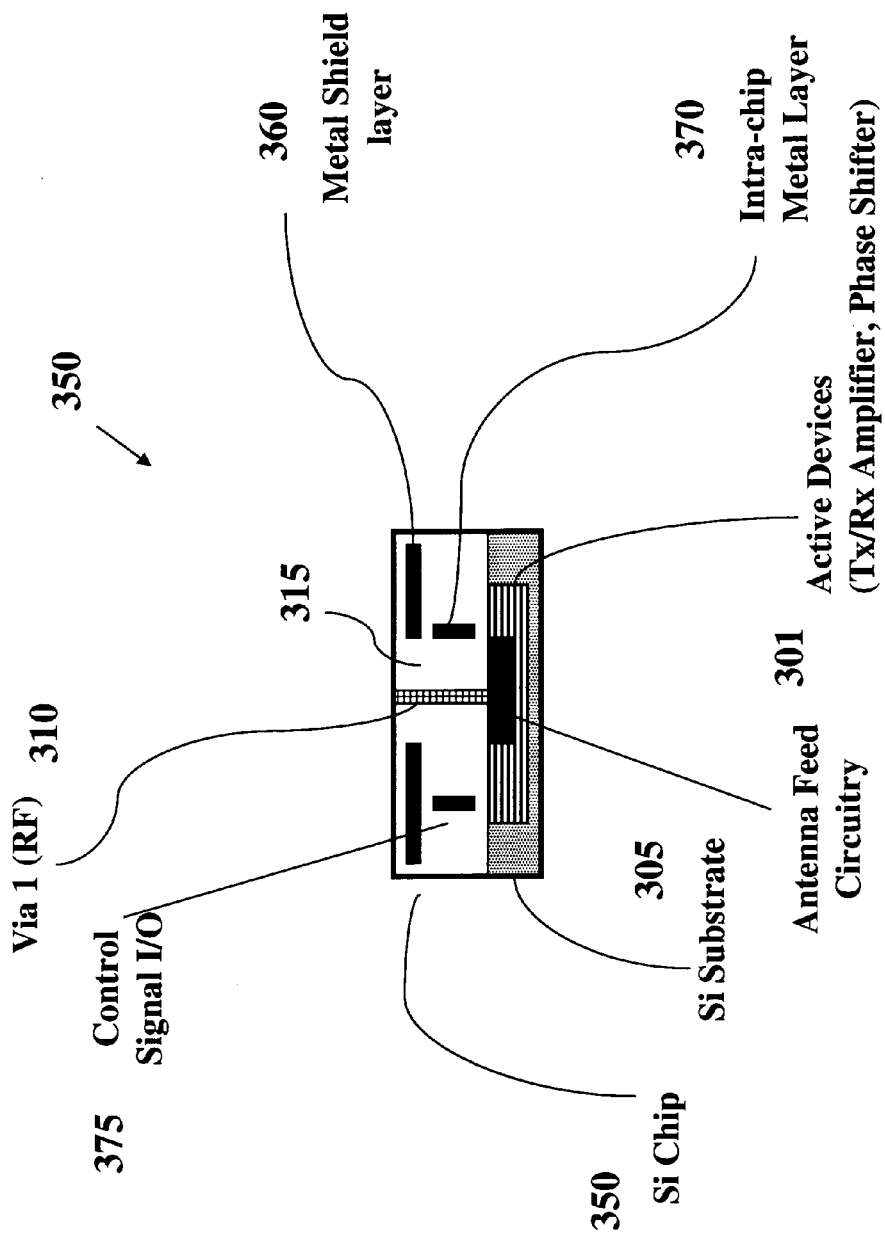
FIG. 3 is a cross-sectional view of an integrated circuit for an antenna array according to an embodiment of the invention.

The beam forming techniques described with respect to FIGS. 1 through 2 may be adapted for use with transparent substrates. A manufacturing process for a beam forming antenna array on a transparent substrate will now be described. The active circuitry for each integrated antenna unit 125 may be constructed on a silicon substrate using conventional CMOS techniques. For example, as illustrated in FIG. 3, the circuitry for a plurality of integrated antenna circuits 125 may be formed on a substrate 305 such as silicon. This active circuitry is represented by antenna feed circuitry, amplifiers, and phase shifter circuitry 301. Active circuitry 301 couples to conductive vias 310 in an insulating layer 315. The resulting device may be denoted an antenna module 350. After formation of antenna module 350, the thickness of substrate 305 may be reduced by grinding the backside to a thickness of a few hundreds of micrometers. Antenna module 350 may utilize the multiple metal layers available in conventional CMOS construction to form an optional shield layer 360 and/or transformers 370 as discussed, for example, in U.S. Ser. No. 10/423,129. In an inductively-coupled embodiment, control signals 375 for the phase-shifting and/or attenuation within integrated antenna circuits 125 would couple through transformers 370.

Figure 4:
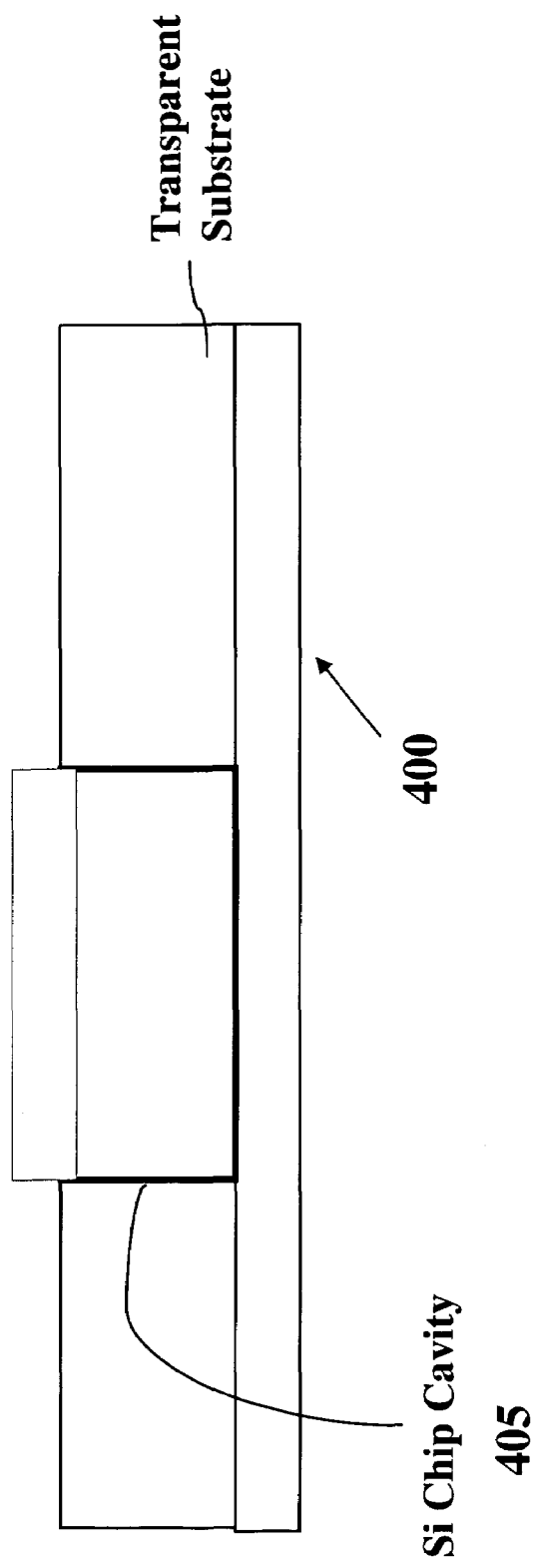
FIG. 4 is a cross-sectional view of a transparent substrate etched to receive the integrated circuit of FIG. 5.
Figure 5:
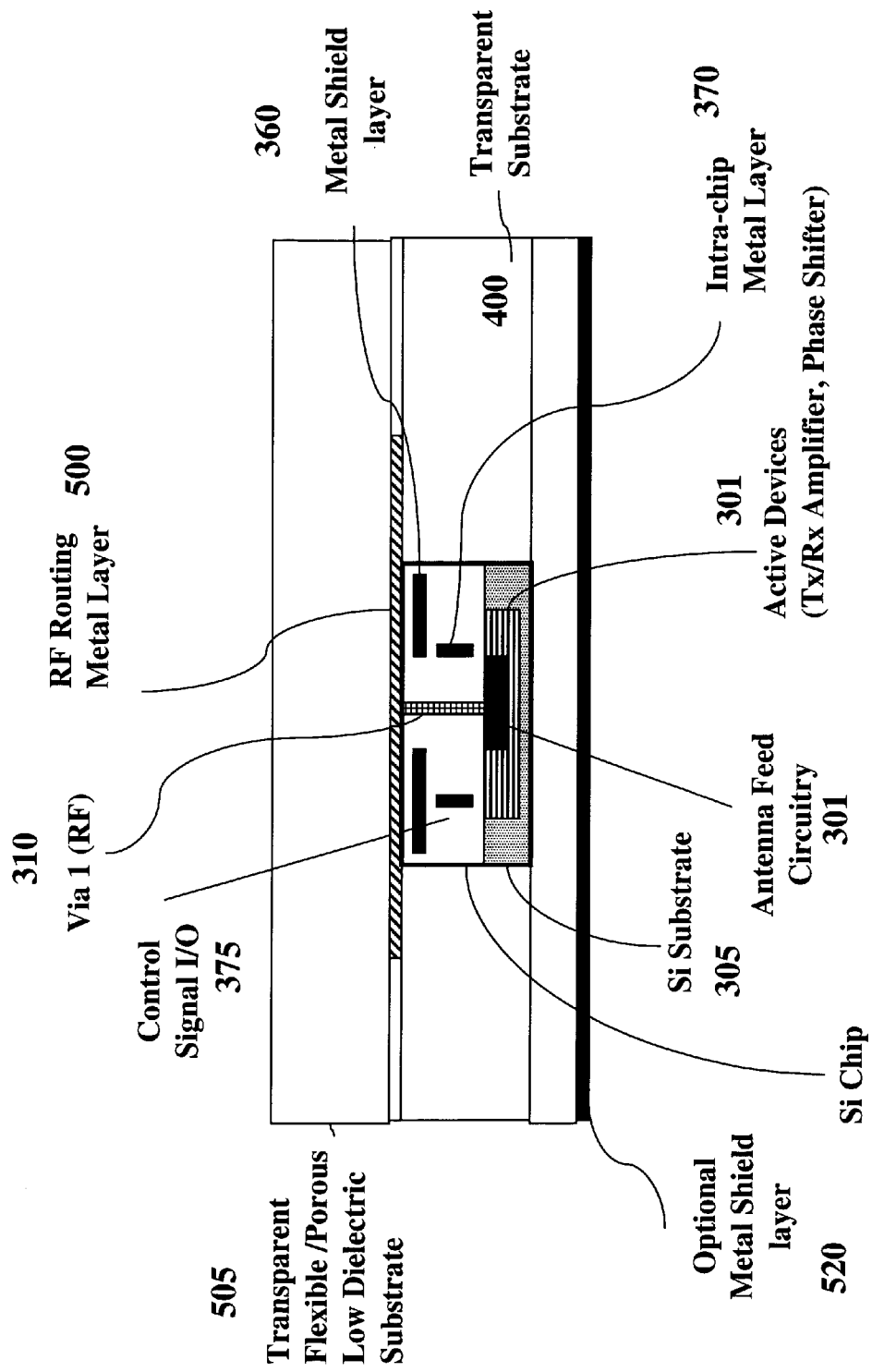
FIG. 5 is a cross-sectional view of the transparent substrate receiving the antenna module and covered with a transparent low dielectric layer.

A transparent substrate may be configured for receiving antenna module 350 as shown with respect to FIG. 4. A transparent substrate 400 such as glass, plastic or similar material having suitable electrical and optical properties may be patterned using photolithography and then etched by chemical or reactive ion etching to form a cavity 405 adapted to receive antenna module 350. Alternatively, ion milling or other suitable techniques may be used. Antenna module 350 may then be sealed into cavity 405 and an RF routing layer 500 formed as shown in FIG. 5. Target alignment patterns may be etched after formation of RF routing layer 500 for the precise location of vias (described below). A layer 505 of porous low dielectric material, or honeycomb structure separates an antenna (described below) from the antenna module 350. In this fashion, the antenna is decoupled from substrate 400 to improve antenna gain and minimize power reflection to substrate 400. Additionally, thin plates of a high dielectric material such as $Ta_2O_5$ may be used to reduce horizontal surface waves prior to the patterning of the antenna. The backside of transparent substrate 400 may be coated with a layer 520 of transparent conducting material such as indium oxide.

Figure 6:
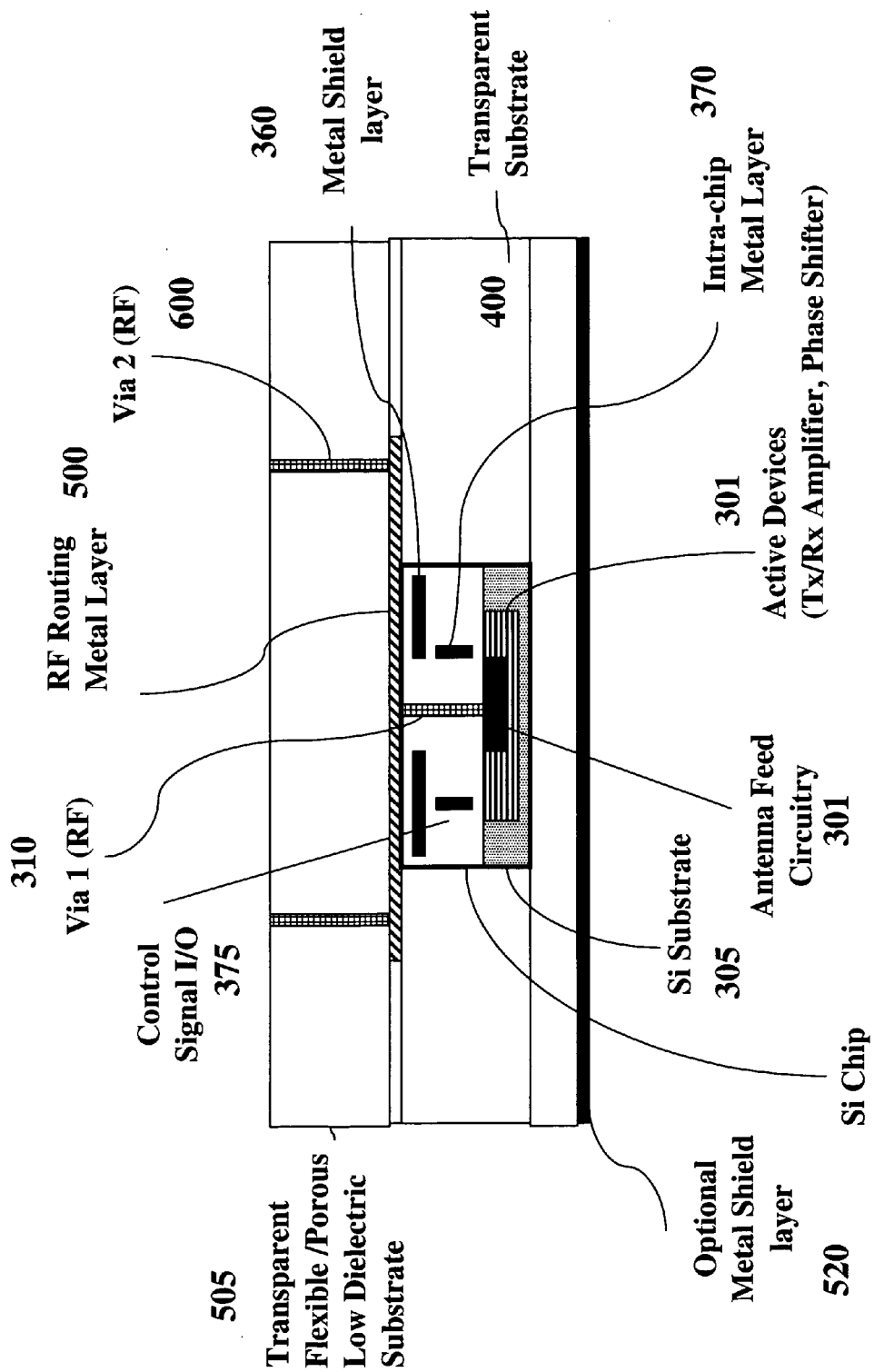
FIG. 6 is a cross-sectional view of the transparent substrate of FIG. 5 with RF vias in the low dielectric layer.

As seen in FIG. 6, conductive vias 600 may then be formed in layer 505 for coupling to the antenna. Fine conductive screws or metal rods may be used to form the vias. Because the screws or rods would couple to the RF routing metal layer 500, this metal layer assists the formation of ohmic contacts to vias 600 while minimizing the possibilities of cracking transparent substrate 400. Alternatively, the vias may be formed using a laser or high energy ion milling techniques and then filled using metals such as Ni, Cr, or Cu. Precise location of vias 600 may be achieved using the alignment marks discussed with respect to FIG. 5.

Figure 7:
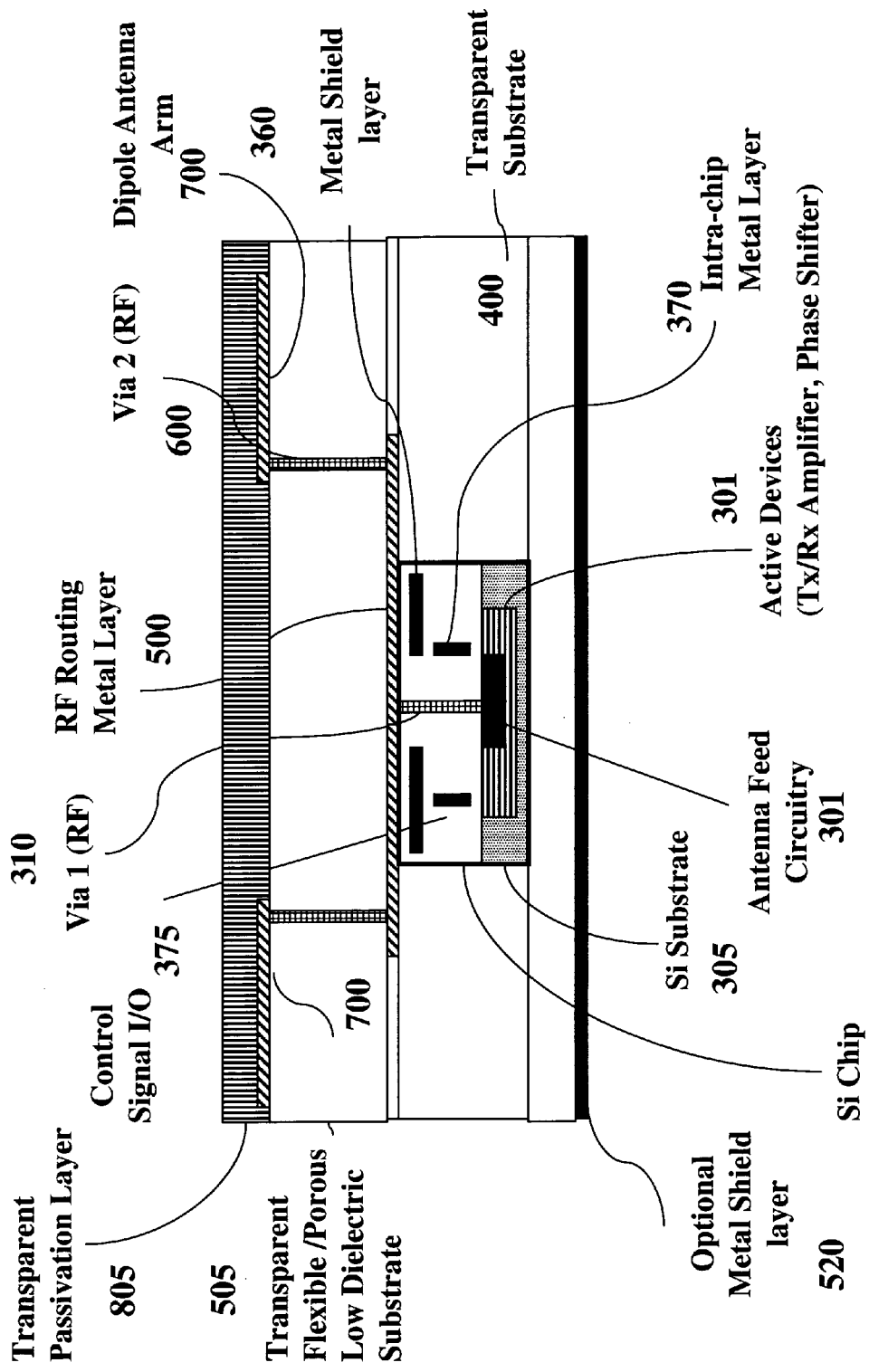
FIG. 7 is a cross-sectional view of the transparent substrate of FIG. 6 with a plurality of antennas being formed on a surface of the transparent substrate.

Turning now to FIG. 7, an antenna such as a dipole antenna 700 may be formed using photolithography in a metal layer formed on layer 505. After formation of antenna 700, the process may be completed by the formation of a passivation layer 705 for impedance matching to free space as well as protection from the elements. The metal layer forming antenna 700 may be enhanced by the deposition of a thin layer of titanium or other suitable metals such as chromium or nickel to provide an absorption layer for optical light. By focusing a concentrated laser beam onto such deposits, a micro soldering of vias 600 to antenna 700 is effected.

Each antenna 700 could be coupled to an individual RF beam forming interface circuit 160 within RF module 350 for maximum beam steering capability. However, to save costs and minimize the number of RF modules 350 incorporated into transparent substrate 400, a plurality of antennas 700 may share the same beam forming interface circuit 160. In such an embodiment, the antennas 700 sharing the same beam forming interface circuit 160 would be receive or transmit at the same phase. The antennas 700 within such a group may be denoted as a sub-array. Beamsteering would thus be accomplished by commanding different phases (and/or attenuations) to the various sub-arrays.

Figure 8C:
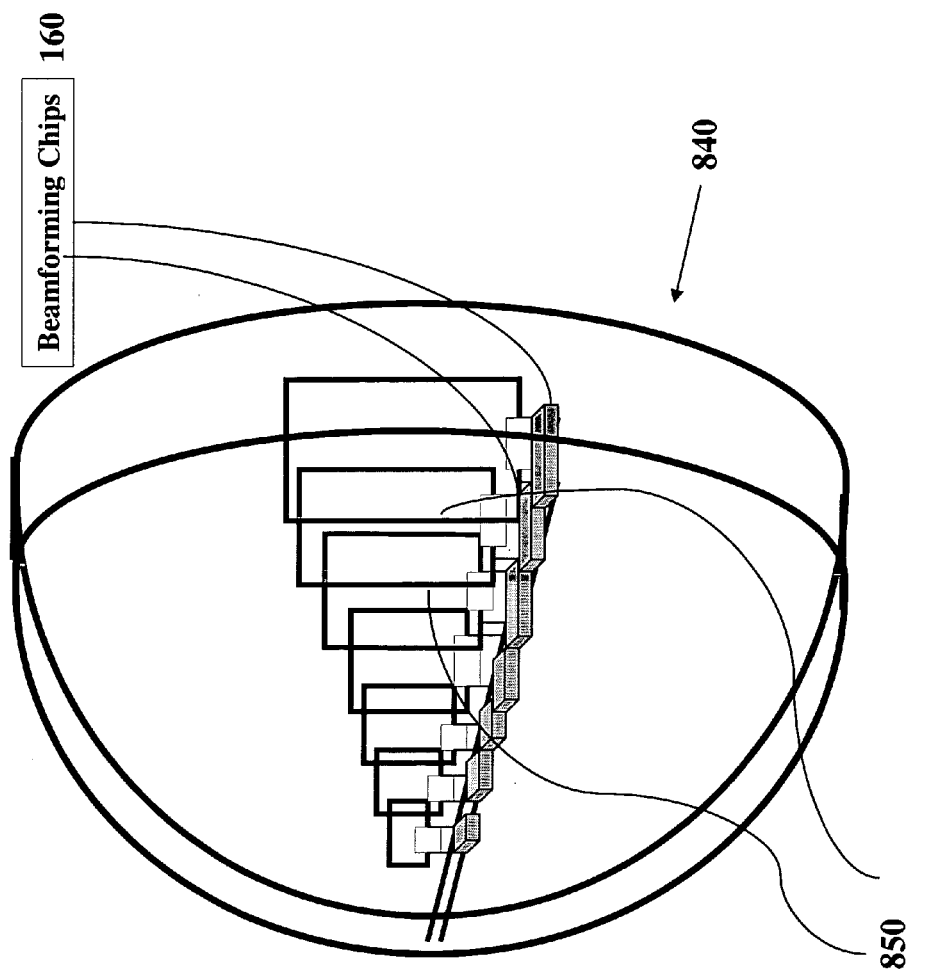
FIG. 8c is a perspective view of an antenna array within the automotive headlight of FIG. 8b.

The integration of beam forming antenna sub-arrays onto a transparent substrate described with respect to FIGS. 3 through 7 has numerous applications. For example, automotive collision avoidance systems typically use a beam forming radar system to detect and locate possible hazards. One problem for such systems involves the determination of a suitable mounting spot for the radar antenna. A mechanically-steered antenna is bulky and interferes with aerodynamics and design considerations. However, the location of an electrically-steered antenna array is also hampered by the sheet metal exterior of automobiles. By incorporating antenna sub-arrays into an automobile's transparent headlight covers, the interference of the sheet metal is avoided. For example, a conventional automotive headlight 800 is illustrated in FIG. 8*a*. To provide low beam/high beam capability, separate bulbs 805 may be provided against a reflective background 810. As seen in FIG. 8*b*, a transparent covering 820 for the headlight may be configured with an array 809 of antenna elements 815 using the techniques described herein. Transparent covering 820 may comprise a planar transparent substrate or it may be conformal as required by design or aerodynamic concerns. As discussed above, sets of antenna elements 815 may all be coupled to a common beam forming interface circuit 160 to lower manufacturing costs. Each set of antenna elements forms a sub-array that would be phased in common by the corresponding beam forming interface circuit. For example, a sub-array 825 of antenna elements may be driven by a common beam forming interface circuit 160. Headlight 800 includes a substrate 830 transversely oriented to the light projection direction that acts to separate bulbs 805. As seen in FIG. 8*c*, substrate 830 may also include an antenna array 840 of elements such as staggered dipole loops 850. To allow array 840 to beam steer, each dipole loop 850 may be driven by a beam forming interface circuit 160. Array 840 may be configured to provide a wider beam such that array 840 could be used for coarse targeting in an automotive collision avoidance system. Array 809 could then be used for fine targeting.

Figure 9:
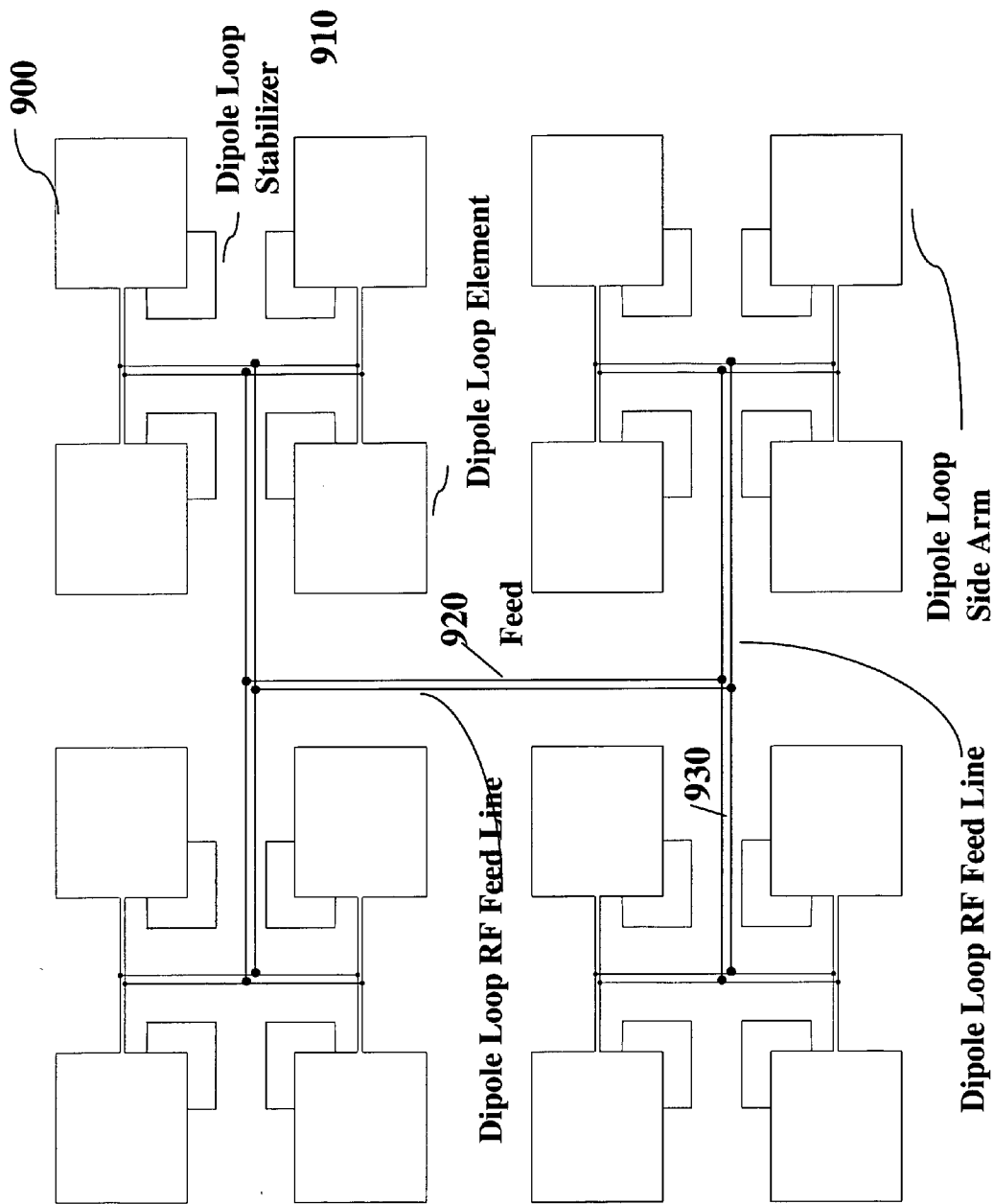

The topology of antenna elements 815 in array 809 is arbitrary. A typical spacing of elements 815 depends upon the operating frequency in that the spacing is generally a fraction of a wavelength such as one-half wavelength. As seen in FIG. 9, a convenient topology is a repeated dipole loop element 900. An optional stabilizer 910 for each loop 900 causes widening of the electrical bandwidth, thereby making the design insensitive to normal variations that exist during the manufacturing process. In an application wherein the array may interfere with other optical functions such as a headlight or windshield mounting, the thickness of the wire used to form loops 900 may be 100 micrometers or less. A single beam forming interface circuit (not illustrated) may be used to drive the array of loop elements 900 at feed point 920. It will be appreciated that the number of elements driven by a single beam forming interface circuit may be increased through the use of repeater amplifiers as necessary.

As seen in FIG. 9, a single RF feed 920 may be used to drive to or receive from antennas 900. A distribution network 930 connecting feed 920 to antennas 900 is designed similar to a clock distribution tree in that the same phase delay should be encountered for each antenna 900 with respect to an RF feed signal being driven into RF feed 920. Although described with respect to integration on a transparent substrate, it will be appreciated that such an antenna array may be integrated onto a semiconductor substrate. Indeed, the use of a semiconductor substrate is advantageous in that distribution network 930 may be constructed with conventional processing techniques such as CMOS using a planar waveguide as described in U.S. Ser. No. 11/004,402, filed Dec. 3, 2004, the contents of which are incorporated by reference in their entirety.

Figure 10:
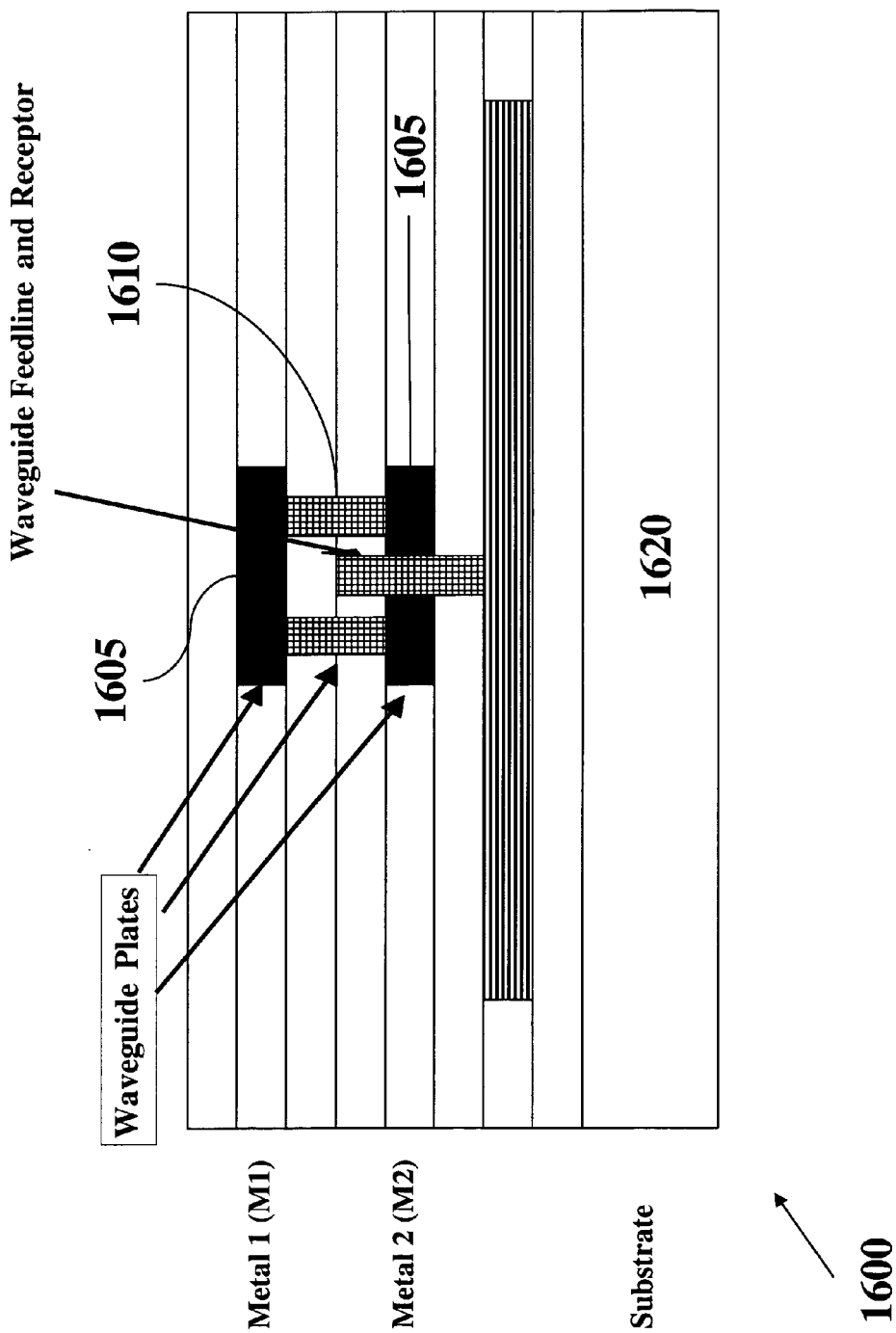
FIG. 10 is a cross-sectional view of a waveguide for coupling to beam forming interface circuit according to an embodiment of the invention.
Figure 11:
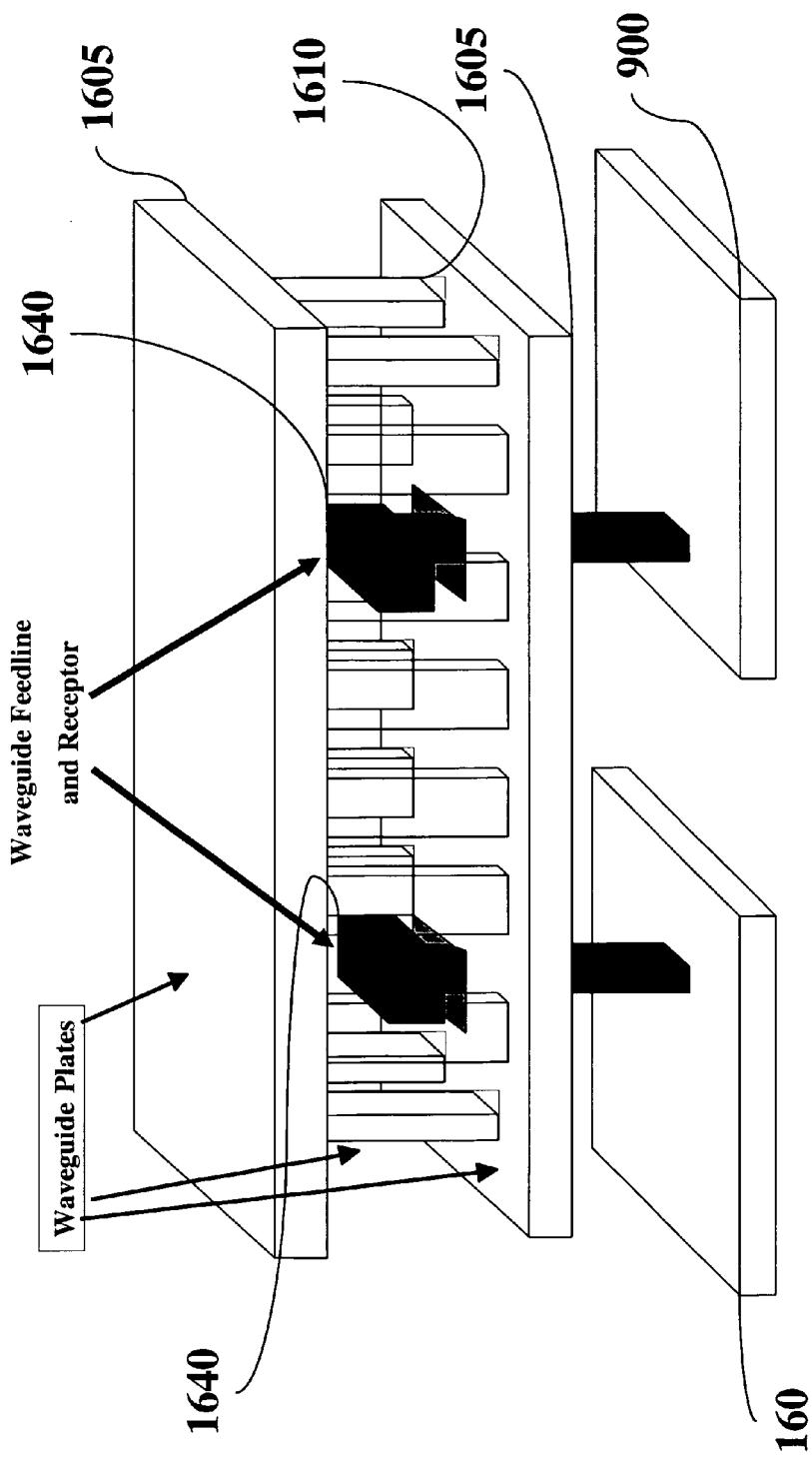
FIG. 11 is a perspective view, partially cutaway, of the waveguide of FIG. 10, implemented using a semiconductor process such as CMOS.

An exemplary planar waveguide 1600 is illustrated in FIG. 10 and comprises two metal plates 1605 within metal layers M1 and M2 formed on a substrate 1620. Metal plates 1605 may be formed using conventional photolithographic techniques. To construct the sidewalls of waveguide 1600, a plurality of vias 1610 couple between metal plates 1605. FIG. 11 is a perspective view of waveguide 1600 with the semiconductor insulating layers cutaway. Vias 1610 may be separated by distances of up to one-half to a full wavelength of the operating frequency. A feedline may be used to excite transmissions within waveguide 1600 that are received by receptors. Because the construction of such feedlines and receptors is symmetric, they will be generically referred to herein as "feedline/receptors" 1640. Thus, feedline/receptors 1640, which may be formed as T-shaped monopoles, excite transmissions within waveguide 1600 or may act to receive transmissions. A beamforming interface circuit 160 may be used to drive feedline/receptor 1640. The resulting signal may then propagate through waveguide 1600 to the opposite feedline/receptor 1640 so as to drive antenna 900. Similarly, in a receive configuration, antenna 900 drives the corresponding feedline/receptor 1640 to propagate a received signal through waveguide 1600 to the opposite feedline/receptor 1640. At this point, the received RF signal may be phase-shifted and/or attenuated in beam forming interface circuit 160 responsive to a beam forming command and then coupled to an IF stage (not illustrated). In that regard, signals may travel unidirectionally from one feedline/receptor 1640 to another feedline/receptor 1640 or bidirectionally between feedline/receptors 1640 in a half or full duplex fashion.

Figure 12A:
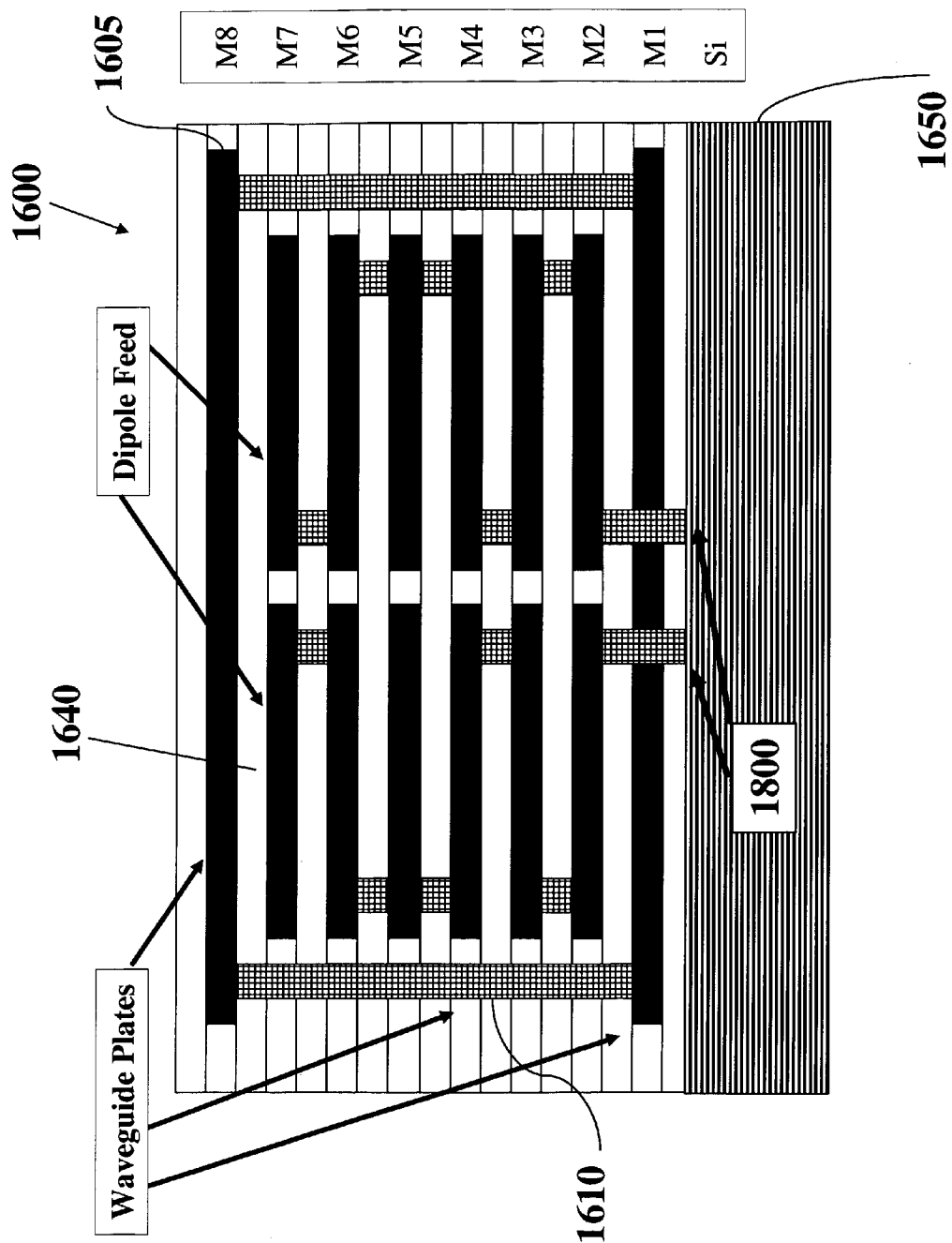
FIG. 12a is a cross-sectional view of a waveguide having a mural-type dipole feed according to one embodiment of the invention.
Figure 12B:
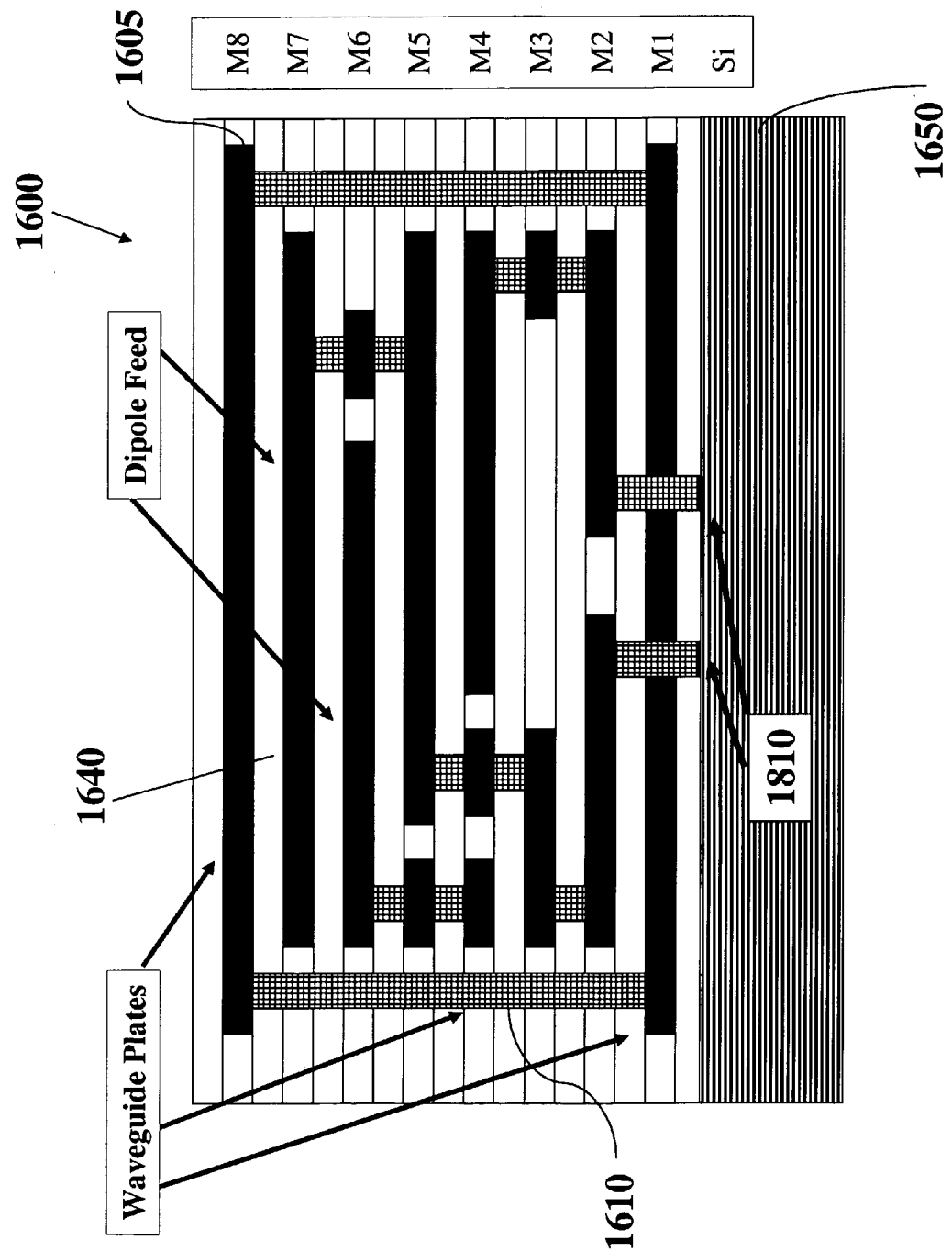
FIG. 12b is a cross-sectional view of a waveguide having an interleaved mural-type dipole feed according to one embodiment of the invention.
Figure 12C:
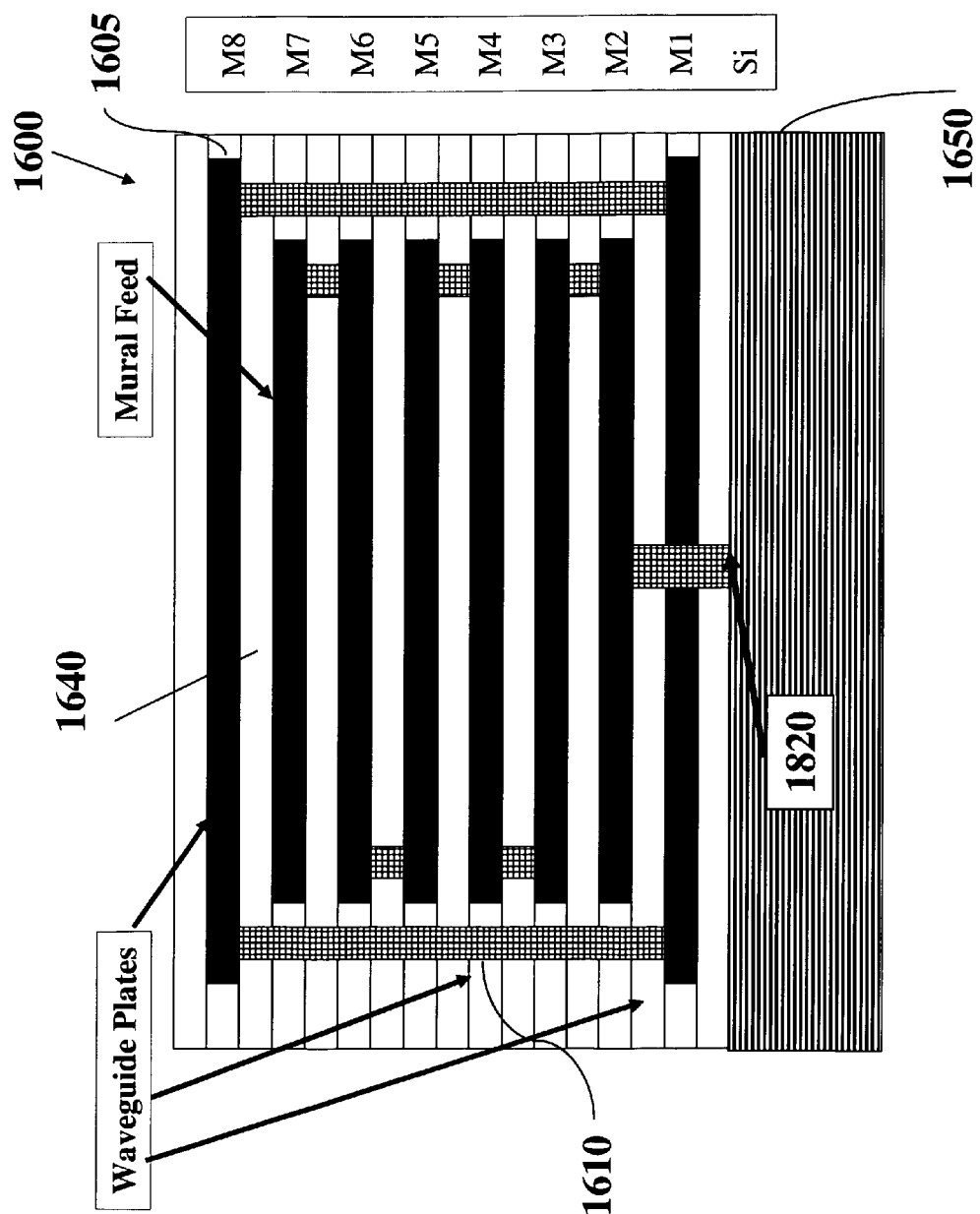
FIG. 12c is a cross-sectional view of a waveguide having a mural-type monopole feed according to one embodiment of the invention.
Figure 12D:
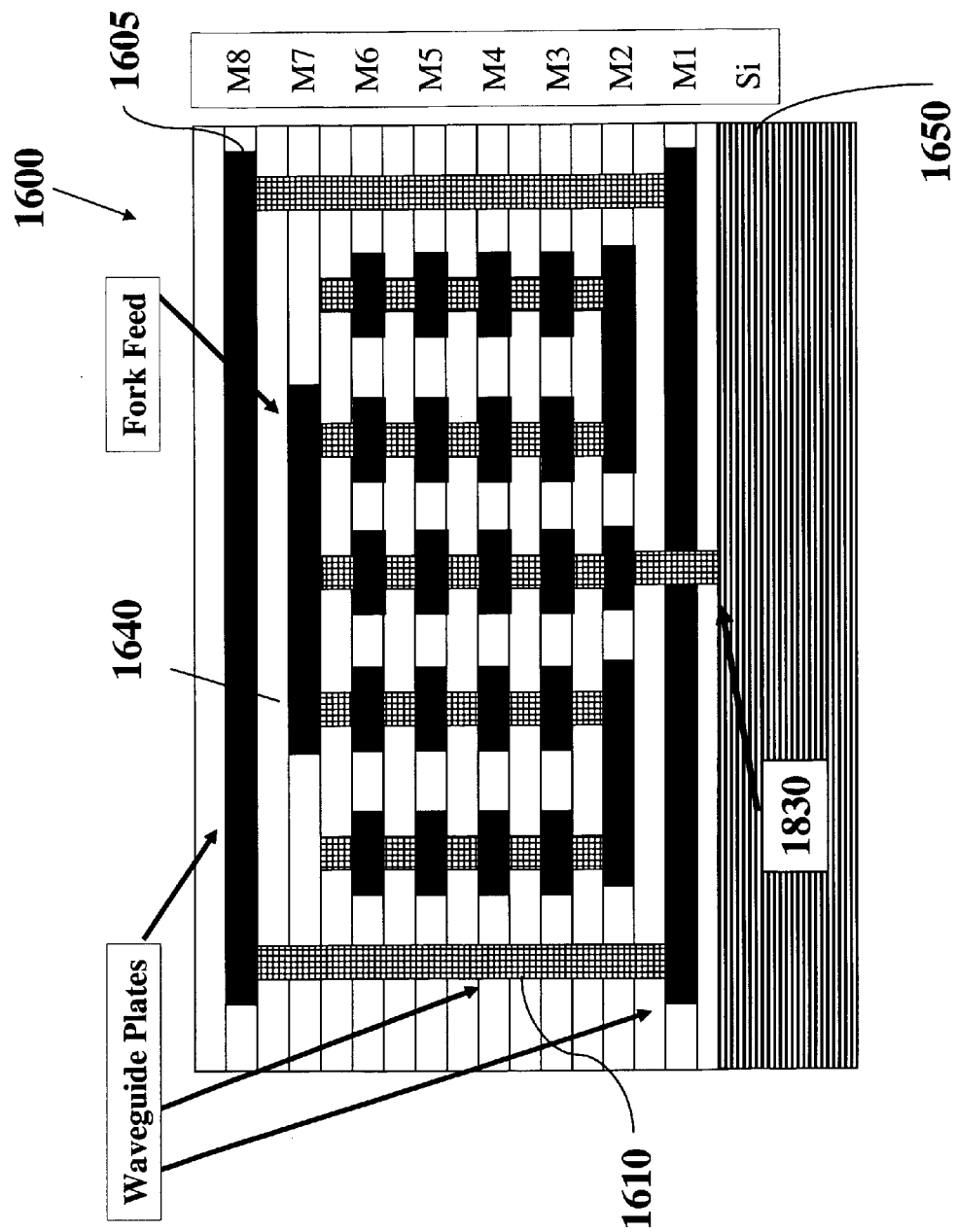
FIG. 12d is a cross-sectional view of a waveguide having a mural-type fork feed according to one embodiment of the invention.

Numerous topologies are suitable for feedline/receptors 1640 depending upon application requirements. For example, FIG. 12a illustrates a cross-section of waveguide 1600 formed using an 8-metal layer semiconductor process such as CMOS. Waveguide plates 1605 are formed in metal layers M1 and M8. Feedline/receptor 1640 comprises a mural-type dipole 1800 of plates formed in metal layers M2 through M7 to generate a traveling wave such having a desired TE or TM mode with minimal additional mode generation that incorporates a quarter wavelength length in a relatively compact area. Dipole 1800 has a relatively low coupling capacitance and is thus suitable for inductive coupling and matching applications. In an alternate embodiment, an interleaved mural-type dipole 1810 as seen in cross section in FIG. 12b may be used to transmit through waveguide 1600. Dipole 1810 may also generate a TE or TM propagation mode with minimal additional mode generation. In another embodiment, a mural-type monopole 1820 as seen in cross-section in FIG. 12c may be used to transmit through waveguide 1600. Monopole 1820 may generate a desired TE or TM mode propagation mode. Alternatively, a fork-type monopole feed 1830 as seen in cross section in FIG. 12d may be used to generate a desired TE or TM propagation mode. Advantageously, the use of fork-type monopole feed 1830 avoids patterning and manufacturing of long lines of metal raise issues with metal patterning definition (photolithographic process) or etching (removing undesired portions of the metal).

Figure 12E:
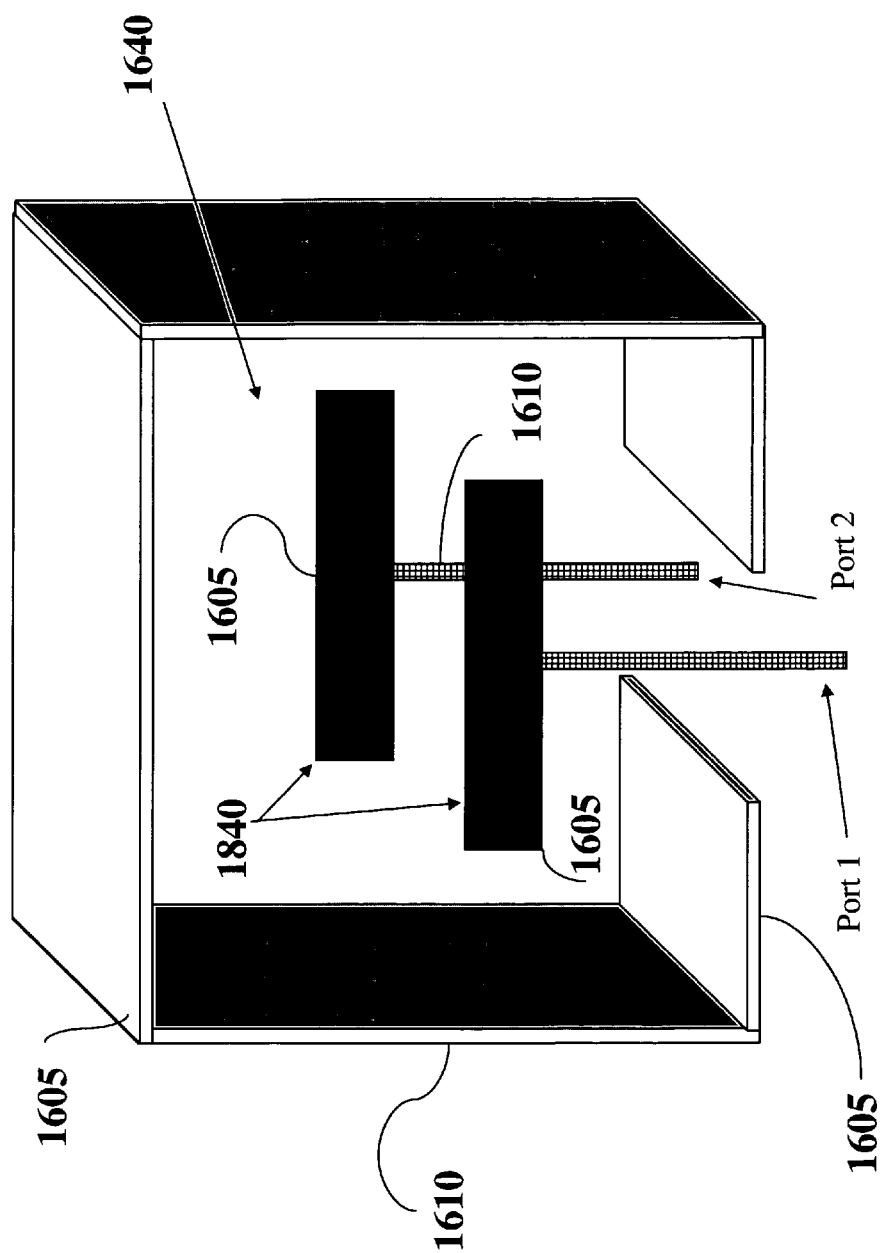
FIG. 12e is a perspective view, partially cutaway of a T-shaped dipole feed for a waveguide according to one embodiment of the invention.
Figure 12F:
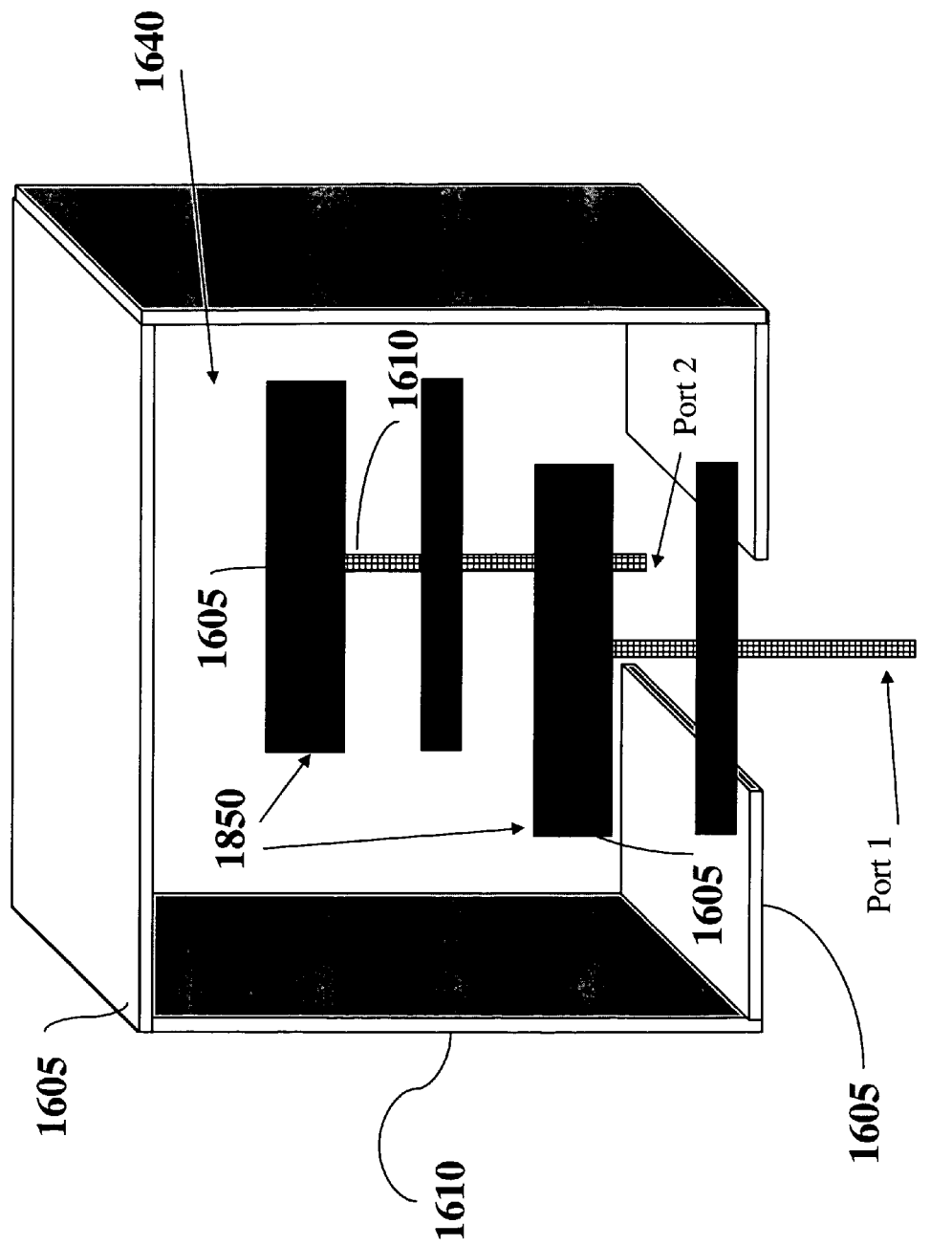
FIG. 12f is a perspective view, partially cutaway of a dual-arm-T-shaped dipole feed for a waveguide according to one embodiment of the invention.

A T-shaped dipole design for feedline/receptor 1640 has the advantage of simplicity and mode minimization. As seen in perspective view in FIG. 12e, a T-shaped dipole 1840 may be formed in adjacent metal layers of a semiconductor process. Simulation results indicate that at an operating frequency of 80 GHz, T-shaped dipole 1840 may achieve a return loss (S11) of −32 dB. By adding an additional "T" arm to form double-arm T-shaped dipole 1850 as seen in FIG. 12f, the return loss may be reduced to −43 dB.

Regardless of the topology implemented for feedline/receptor 1640 in waveguide 1600, its dimensions are limited by the furthest separation achievable between the metal layers used to form waveguide plates 1605. For example, if the first and eighth metal layers are used to form waveguide plates 1605 in a conventional 8-metal-layer semiconductor process such as CMOS, this separation is approximately seven micrometers. Such a separation is adequate for 40 GHz and higher frequency signals propagated though waveguide 1600 which would correspond to a feedline/receptor 1640 length of a few hundred microns to a few millimeters. It will be appreciated that planar waveguides 1600 could also be formed on transparent substrates such that the insulating dielectric layers would also be formed from transparent materials.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

I claim:

1. An antenna array, comprising:
   a transparent substrate having a cavity;
   a first plurality of antennas formed on a surface of the transparent substrate; and a first integrated circuit secured in the cavity, the first integrated circuit including a first RF beam forming interface circuit adapted to perform at least one of phase-shifting and attenuating an for signal according to a first transmit beam forming command to form an RF driving signal for driving the first plurality of antennas, the first RF beam forming interface circuit also adapted to perform at least one of phase-shifting and attenuating a received RF signal from the first plurality of antennas according to a first receive beam forming command.

2. The antenna array of claim 1, wherein the first plurality of antennas comprise dipole antennas.

3. The antenna array of claim 1, wherein the transparent substrate is an automotive headlight transparent substrate.

4. The antenna array of claim 1, wherein the first RF beam forming circuit is adapted to only phase-shift the RF signal according to the first transmit beam forming command, and wherein the first integrated circuit is adapted to only phase-shift the received RF signal according to the first receive beam forming command.

5. The antenna array of claim 1, further comprising:
a second plurality of antennas formed on the surface of the transparent substrate; and
a second integrated circuit, the second integrated circuit including a second RF beam forming interface circuit adapted to perform at least one of phase-shifting and attenuating the RF signal according to a, second transmit beam forming command to form an RF driving signal for driving the second plurality of antennas, the second RF beam forming interface circuit also adapted to perform at least one of phase-shifting and attenuating a received RF signal from the second plurality of antennas according to a second receive beam forming command.

6. The antenna array of claim 5, further comprising:
a beam forming controller adapted to provide the first and second transmit and receive beam forming commands.

7. The antenna array of claim 1, wherein the transparent substrate includes conductor-filled vias for conducting the RF driving signal from the first RF beam forming circuit to the first plurality of antennas and for conducting the received RF signal from the first plurality of antennas to the first RF beam forming circuit.

8. The antenna array of claim 1, wherein the first integrated circuit includes transformers adapted to inductively receive the first receiver and transmit beam forming commands.

9. The antenna array of claim 1, wherein the first plurality of antennas comprise dipole loop antennas.

10. The antenna array of claim 1, wherein the transparent substrate comprises glass.

11. The antenna array of claim 1, wherein the transparent substrate comprises plastic.

12. The antenna array of claim 1, further comprising a passivation layer overlaying the first plurality of antennas.

13. A method of manufacturing an antenna array, comprising:
providing an integrated circuit including a RF beam forming interface circuit adapted to perform at least one of phase-shifting and attenuating an RF signal according to a transmit beam forming command to form an RF driving signal, the RF beam forming interface circuit also adapted to perform at least one of phase-shifting and attenuating a received RF signal according to a receive beam forming command;
etching a cavity in a transparent substrate;
securing the integrated circuit in the cavity;
forming conductor-filled vias from the cavity to a surface of the transparent substrate; and
forming a plurality of antennas on the surface of the transparent, each antenna being coupled to corresponding ones of the conductor-filled vias, wherein the integrated circuit is secured in the cavity such that the RF driving signals drives the plurality of antennas and the received RF signal couples from the plurality of antennas to the RF beam forming circuit.

14. The method of claim 13, further comprising:
forming a metal shield layer between the integrated circuit and the plurality of antennas.

15. The method of claim 13, further comprising:
coupling the conductor-filled vias to the antennas using laser energy.

16. An antenna circuit, comprising:
a substrate,
a first longitudinal conducting plate formed on the substrate;
a first dielectric layer formed on the first longitudinal conducting plate;
a second longitudinal conducting plate formed on the first dielectric layer;
a first plurality of conducting vias extending from a first side of the first longitudinal conducting plate to a first side of the second longitudinal conducting plate;
a second plurality of conducting vias extending from a second side of the first longitudinal conducting plate to a second side of the second longitudinal conducting plate, wherein the combination of the first and second longitudinal conducting plates and the first and second conducting vias forms a rectangular waveguide encompassing a portion of the first dielectric layer;
at least one antenna formed on the substrate;
a circuit integrated with the substrate and adapted to receive an RF signal from the waveguide, the integrated circuit including an RF beam forming interface circuit adapted to perform at least one of phase-shifting and attenuating the RF signal according to a transmit beam forming command to form an RF driving signal for driving the at least one antenna, the RF beam forming interface circuit also adapted to perform at least one of phase-shifting and attenuating a received RF signal from the first plurality of antennas according to a receive beam forming command to form an adjusted received RF signal, the RF beam forming interface circuit being adapted to transmit the adjusted received RF signal into the waveguide.

17. The antenna circuit of claim 16, wherein the RF beam forming interface circuit is adapted to receive the RF signal from the waveguide through a T-shaped dipole.

18. The antenna circuit of claim 16, wherein the RF beam forming interface circuit is adapted to receive the RF signal from the waveguide through a mural-type dipole.

19. The antenna circuit of claim 16, wherein the the RF beam forming interface circuit is adapted to receive the RF signal from the waveguide through an interleaved mural-type dipole.

20. The antenna circuit of claim 16, wherein the substrate is a silicon substrate.

* * * * *

UNITED STATES PATENT AND TRADEMARK OFFICE
CERTIFICATE OF CORRECTION

PATENT NO. : 7,126,541 B2 Page 1 of 1
APPLICATION NO. : 11/049098
DATED : October 24, 2006
INVENTOR(S) : Farrokh Mohamadi It is certified that error appears in the above-identified patent and that said Letters Patent is hereby corrected as shown below:

Col. 9, Line 4, Delete "for", replace with --RF--.

Signed and Sealed this

Thirteenth Day of November, 2007

JON W. DUDAS
*Director of the United States Patent and Trademark Office*